United States Patent
Giannopoulos et al.

(10) Patent No.: US 10,832,772 B2
(45) Date of Patent: Nov. 10, 2020

(54) APPARATUS FOR A MEMRISTOR CROSSBAR ARRAY

(71) Applicant: International Business Machines Corporation, Armonk, NY (US)

(72) Inventors: Iason Giannopoulos, Thalwil (CH); Abu Sebastian, Adliswil (CH); Evangelos Stavros Eleftheriou, Rueschlikon (CH); Manuel Le Gallo-Bourdeau, Zurich (CH); Vara Sudananda Prasad Jonnalagadda, Wallisellen (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/238,893

(22) Filed: Jan. 3, 2019

(65) Prior Publication Data
US 2020/0118624 A1    Apr. 16, 2020

Related U.S. Application Data

(60) Provisional application No. 62/745,550, filed on Oct. 15, 2018.

(51) Int. Cl.
  *G11C 11/00* (2006.01)
  *G11C 13/00* (2006.01)
  (Continued)

(52) U.S. Cl.
  CPC ...... *G11C 13/0035* (2013.01); *G11C 13/0004* (2013.01); *G11C 13/004* (2013.01);
  (Continued)

(58) Field of Classification Search
  CPC .............. G11C 13/0035; G11C 13/004; G11C 13/0004; G11C 2013/0045;
  (Continued)

(56) References Cited

U.S. PATENT DOCUMENTS 7,576,565 B2    8/2009  Mouttet
7,817,465 B2   10/2010  Oh et al.
(Continued)

FOREIGN PATENT DOCUMENTS

WO      2016/164049 A1    10/2016

OTHER PUBLICATIONS

Bayat, F.M., et al., "Implementation of Multilayer Perceptron Network with Highly Uniform Passive Memristive Crossbar Circuits", Nov. 2017, https://arxiv.org/ftp/arxiv/papers/1712/1712.01253.pdf, Accessed on Dec. 11, 2018, 26 pages.
(Continued)

*Primary Examiner* — Tha-O H Bui
(74) *Attorney, Agent, or Firm* — Scully, Scott, Murphy & Presser, P.C.; Daniel P. Morris (57) ABSTRACT

The present disclosure relates to an apparatus for a memristor crossbar array. The apparatus comprises an adjustment circuit configured for receiving a current that is output by the array at an actual operating condition of the array. The apparatus further comprises a calibration circuit configured for determining a measured or modelled variation of output currents of the array at the actual operating condition with respect to a reference operating condition, wherein the adjustment circuit is configured to adjust the output current by the variation.

19 Claims, 3 Drawing Sheets

(51) Int. Cl.
   *H01L 45/00*    (2006.01)
   *H01L 27/24*    (2006.01)
(52) U.S. Cl.
   CPC .......... *H01L 27/2463* (2013.01); *H01L 45/06* (2013.01); *H01L 45/08* (2013.01); *H01L 45/1233* (2013.01); *H01L 45/1253* (2013.01); *G11C 2013/0045* (2013.01)
(58) Field of Classification Search
   CPC ..... H01L 45/1253; H01L 45/08; H01L 45/06; H01L 45/1233; H01L 27/2463
   USPC ........................................................ 365/148
   See application file for complete search history.

(56) References Cited

U.S. PATENT DOCUMENTS

| | | | |
|---|---|---|---|
| 9,437,602 B2 | 9/2016 | Chakrabartty et al. | |
| 2010/0118595 A1* | 5/2010 | Bae .................... | G11C 13/0038 365/148 |
| 2014/0369114 A1 | 12/2014 | Kim et al. | |
| 2015/0003144 A1 | 1/2015 | Eleftheriou et al. | |
| 2015/0221365 A1* | 8/2015 | Park .................... | G11C 29/021 365/163 |
| 2016/0179113 A1* | 6/2016 | Taigor .................... | G11C 16/06 327/513 |
| 2018/0260696 A1* | 9/2018 | Suda ...................... | G06N 3/049 |

OTHER PUBLICATIONS

Yuan, Y., et al., "6-bit Step Attenuators for Phased-Array System With Temperature Compensation Technique", IEEE Microwave and Wireless Components Letters, Aug. 2018, pp. 690-692, vol. 28, No. 8.
Le Gallo, M., "Compressed Sensing Recovery using Computational Memory", IEDM17, Dec. 6, 2017, pp. 28.3.1-28.3.4.
Le Gallo, M., "Mixed-precision in-memory computing", Nature Electronics, Apr. 2018, pp. 246-253, vol. 1.
Burr, G.W., "Neuromorphic computing using non-volatile memory", Advances in Physics: X, 2017, Accepted Nov. 1, 2016, pp. 8-24, vol. 2, No. 1.
Zidan, M.A., et al., "A general memristor-based partial differential equation solver", Nature Electronics, Jul. 2018, pp. 411-420, vol. 1.
Koelmans, W.W., et al., "Projected phase-change memory devices", Nature Communications, Accepted Jul. 27, 2015, Published Sep. 3, 2015, 7 pages.
Raoux, S., et al., "Phase-change random access memory: A scalable technology", IBM J. Res. & Dev., Jul./Sep. 2008, pp. 465-479, vol. 52, No. 4/5.

* cited by examiner

Determining that $G(T) = G_a(T) + G_p(T)$
401

Determining that $G_a(T) = G_a^* e^{-\frac{E_a}{k_B T}}$ and that
$G_p(T) = \frac{G_{p_0}}{1 + \alpha_p (T - T_0)}$
403

Determining the ratio of their conductances $\lambda$, where
$\lambda(T) = \frac{G_p(T)}{G_a(T)}$
405

Determining the compensation function $h(T)$ where
$h(T) = \frac{1}{1 + \lambda_0} \left[ \frac{\lambda_0}{1 + \alpha_p(T - T_0)} + e^{-\frac{\bar{E}_a}{k_B}\left(\frac{1}{T} - \frac{1}{T_0}\right)} \right]$
407

APPARATUS FOR A MEMRISTOR CROSSBAR ARRAY

BACKGROUND

The present disclosure relates to the field of computer systems, and more specifically, to an apparatus for a memristor crossbar array.

The computational memory is a promising approach in the field of non-von Neumann computing paradigms, in which nanoscale resistive memory devices are simultaneously storing data performing basic computational tasks. For example, by arranging these devices in a crossbar configuration, matrix-vector multiplications may be performed. However, interdevice variability, non-ideal characteristics of resistive memories such as the electronic noise, drift and temperature dependence affect seriously the computational precision.

SUMMARY

Various embodiments provide an apparatus for a memristor crossbar array, memory circuit and method as described by the subject matter of the independent claims. Advantageous embodiments are described in the dependent claims. Embodiments of the present invention can be freely combined with each other if they are not mutually exclusive.

In one aspect, the invention relates to an apparatus for a memristor crossbar array. The apparatus comprises: an adjustment circuit configured for receiving a current that is output by the array at an actual operating condition of the array; a calibration circuit configured for determining a measured or modeled variation of output currents of the array at the actual operating condition with respect to a reference operating condition, wherein the adjustment circuit is configured to adjust the output current by the variation.

In another aspect, the invention relates to a memory circuit comprising an apparatus and a memristor crossbar array, wherein the apparatus comprises: an adjustment circuit configured for receiving a current that is output by the array at a current operating condition of the array; and a calibration circuit configured for providing a reference current at a reference operating condition of the array, and for determining a variation to the reference current at the current operating condition, wherein the adjustment circuit is configured to adjust the output current by the variation.

In another aspect, the invention relates to a method for a memristor crossbar array comprising: receiving a current that is output by the array at an actual operating condition of the array; measuring or modeling a variation of output currents of the array at the actual operating condition with respect to a reference operating condition; adjusting the output current by the variation.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The term "operating condition" refers to a state of the crossbar array at a given point of time e.g. during the operation of the crossbar array. The operating condition may be determined by one or more parameters that may be used to control the operation of the crossbar array. A parameter of the one or more parameters may, for example, be the temperature of the crossbar array. An operating condition may be determined or defined by a value of at least part of the one or more parameters. For example, a reference operating condition of the crossbar array may be defined by a temperature of the array of 300K.

The memristor crossbar array is a set of conductive row wires and a set of conductive column wires that intersect the set of conductive row wires. The conductive column wires may be referred to as column lines and conductive row wires may be referred to as row lines. The intersections between the set of row wires and the set of column wires are separated by memristors. The memristor refers to a device or cell capable of remembering an amount of a current that has been passed. The memristor remembers a charge amount and a resistance of the memristor may be changed according to the charge amount. That is, the resistance of the memristor may be changed according to a flow and amount of current. The memristor of the present disclosure may be a cell of the cells described in applications US 2014/0369114 A1 and US 2015/0003144 A1 the contents of both is incorporated herein by reference in its entirety.

The measurements or outputs of the crossbar array in a same or constant operating condition (e.g. a reference operating condition) of the crossbar array may enable accurate calculations and controllable or analyzable results. However, the change of the operating conditions over time while operating the crossbar array may induce changes or variations to the measurements or outputs of the crossbar array with respect to the reference operating condition of the crossbar array. The present disclosure may enable to control those variations so as to provide precise measurements. The adjustments provided by the present disclosure may be reliable and accurate as they are measured in same operating conditions as the adjusted outputs or they are modeled based on an accurate model of conductance (or resistance) of the cells. This is particularly advantageous as the types of cells being used such as resistive random-access memory (RRAM) cell and phase-change memory (PCM) cells enable an accurate modeling of their conductance e.g. as function of the temperature.

For example, memristive devices or memristors such as metal-oxide or phase-change memories exhibit thermally activated electrical transport. In addition, the activation energy shows interdevice variability. This may make the behavior of the measurements as function of the temperature unknown and an array-level compensation scheme non-applicable. The present disclosure may take into account and correct for operating conditions' induced variations such as temperature induced variations that alter the stored matrix elements leading to erroneous calculations. For example, the present disclosure may enable a temperature-compensation scheme that exploits the structure of phase-change memory cells. An applicable array-level compensation method may be able to precisely predict the stored matrix elements at a temperature, using a single activation energy value for all devices.

According to one embodiment, the calibration circuit comprises a set of memristors having a predefined and stable resistance at the reference operating condition, the set of memristors being configured to be inserted as a column line in the array, wherein the measured variation is the difference between the output current of the set of memristors at the actual operating condition and the output current of the set of memristors at the reference operating condition.

For example, the conductance values of the set of memristors are known and stored for a given reference temperature and may stay unaffected by any programming/mapping process. At a given time (e.g. at a temperature value different from the reference temperature), a given vector of read voltages, may induce a current of the set of memristors. The reference current may be calculated using the stored conductance values and the given read voltages. By comparing the measured current output of the set of memristors and the reference current, a variation of the measured current with respect to the reference current may be derived. And a correction or compensation function for compensating the derived variation may be derived and may be applied on measured currents of other lines of the array at the given time.

This embodiment may enable a measured variation of the measured currents due to changes in operating conditions such as the temperature. This embodiment may enable precise and accurate adjustment of the measured currents.

According to one embodiment, the calibration circuit is configured to provide the determined variation as input to the adjustment circuit.

According to one embodiment, each memristor of the set of memristors is a memristor of the array. Providing the set of memristors using the same cell technology used for the array may further increase the accuracy of the corrections applied by the present method, as the correction may be better matching the rest of lines of the array.

According to one embodiment, each memristor of the set of memristors is a cell for storing information in a plurality of programmable cell states. The cell comprises: an electrically-insulating matrix located between a first electrode and a second electrode such that an electrically-conductive path, extending in a direction between said electrodes, is formed within said matrix on application of a write voltage to said electrodes; an electrically-conductive component in contact and extending between the first electrode and the second electrode; wherein a resistance is presented by said electrically-conductive component; and wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in aside matrix. In another example, each memristor of the set of memristors is a phase-change memory cell includes: a phase-change material located between a first electrode and a second electrode for applying a read voltage to the phase-change material to read a programmed cell state; and an electrically-conductive component extending from the first electrode to the second electrode and in contact with the phase-change material, wherein the resistance presented by the electrically-conductive component to a cell current produced by the read voltage is less than that of the amorphous phase and greater than that of the crystalline phase of the phase-change material.

According to one embodiment, the calibration circuit comprises a memory storing the modeled variation that is determined based on a model of the conductance of the array as function of the operating condition. This may enable a user controllable correction of the measured currents by the crossbar array.

According to one embodiment, the apparatus further comprises a temperature sensitive element for measuring the temperature of the array, wherein the adjustment circuit is configured to receive the measured temperature and to determine the modeled variation using the measured temperature and a model of variation. The temperature sensitive element may be a sensor for sensing or measuring the temperature of the array. For example, the temperature sensitive element may be a circuit or device that is configured for sensing or measuring the temperature of the crossbar array. The temperature sensitive element may, for example, include transistors or diodes or other one or more temperature sensitive electronic devices. This embodiment may particularly be advantageous in case the operating condition induced variations are dominated by temperature.

According to one embodiment, each memristor of the set of memristors is a cell for storing information in a plurality of programmable cell states. The cell comprises: an electrically-insulating matrix located between a first electrode and a second electrode such that an electrically-conductive path, extending in a direction between said electrodes, is formed within said matrix on application of a write voltage to said electrodes; an electrically-conductive component in contact and extending between the first electrode and the second electrode; wherein a resistance is presented by said electrically-conductive component; and wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in aside matrix.

According to one embodiment, the modeled variation is a value of the following model of the variation $$h(T) = \frac{1}{1+\lambda_0}\left[\frac{\lambda_0}{1+\alpha_p(T-T_0)} + e^{-\frac{E_a}{k_B}\left(\frac{1}{T}-\frac{1}{T_0}\right)}\right],$$

T and $T_0$ are the temperatures defining the actual and reference operating conditions respectively, $\bar{E}_a$ is the average activation energy of the electrically-insulating matrix (or of the material of the insulating matrix), $\lambda_0$ is the ratio of the conductance of the electrically-conductive component and the conductance of the electrically-insulating matrix at the reference operating condition, $k_B$ is the Boltzmann constant, $\alpha_p$ is the temperature coefficient of resistance. Modeling the variation based on the structure of the cells of the crossbar array may enable a cross check analysis with the measured variations and thus may enable to better understand the measurements of the crossbar array and their behavior over time.

According to one embodiment, the operating condition is given by a temperature of the array.

Figure 1A:
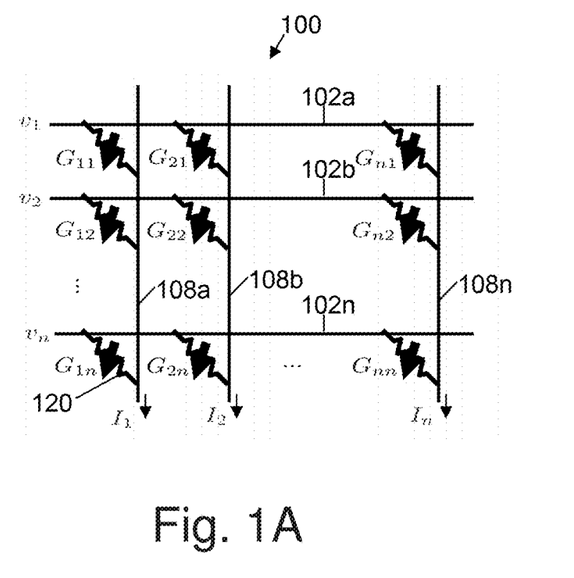
FIG. 1A depicts a cross bar array of memristors in one embodiment.

FIG. 1A depicts a cross bar array of memristors (or resistive processing units (RPUs)) that provide local data storage along with voltage sequences illustrating the operation of the memristor. FIG. 1A is a diagram of a two-dimensional (2D) crossbar array 100 that may, for example, perform matrix-vector multiplication or weight updates. Crossbar array 100 is formed from a set of conductive row wires 102a ... 102n and a set of conductive column wires 108a ... n that intersect the set of conductive row wires 102a-n. FIG. 1A shows the same number of columns and rows n for exemplification purpose; however, the number of columns and rows may be different. The conductive column wires may be referred to as column lines and conductive row wires may be referred to as row lines. The intersections between the set of row wires and the set of column wires are separated by memristors, which are shown in FIG. 1A as resistive elements each having its own adjustable/updateable resistive weight, depicted as $G_{ij}$, respectively where i=1 ... n, and j=1 ... n. For ease of illustration, only one memristor 120 is labeled with a reference number in FIG. 1A.

Input voltages $v_1$ ... vn are applied to row wires 102a-n respectively. Each column wire 108a-n sums the currents $I_1$, $I_2$ ... $I_n$ generated by each memristor along the particular column wire. For example, as shown in FIG. 1A, the current $I_2$ generated by column wire 108$_b$ is according to the equation $I_2=v_1 \cdot G_{21}+v_2 \cdot G_{22}+v_3 \cdot G_{23}+ \ldots +v_n \cdot G_{2n}$. Thus, array 100 computes the matrix-vector multiplication by multiplying the values stored in the memristors by the row wire inputs, which are defined by voltages $v_{1-n}$. Accordingly, the multiplication and addition operations required to perform weight updates are performed locally at each memristor 120 of array 100 using the memristor itself plus the relevant row or column wire of array 100.

Figure 1B:
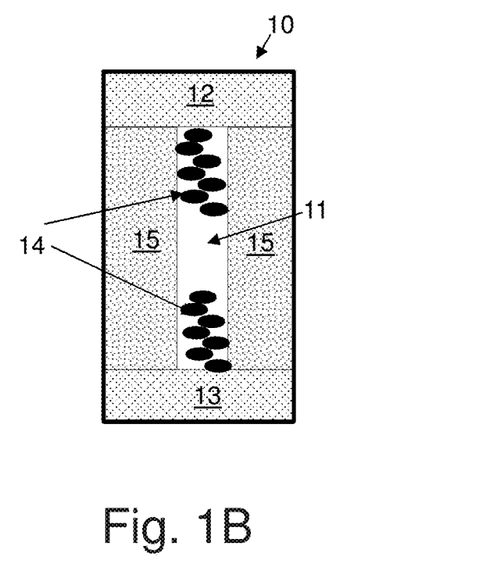
FIG. 1B shows a memory cell in one embodiment in accordance with an example the present disclosure.

FIG. 1B shows a memory cell in accordance with an example of the present disclosure. FIG. 1B is a schematic cross-sectional view of a memory cell according to an example of the present disclosure. The cell 10 has an electrically-insulating matrix material (RRAM material) 11 located between the first and second electrodes, 12 and 13, for connecting the cell to the word and bit lines, respectively, of the array e.g. 100. Such electrodes can be referred to herein as a "top" electrode (TE) and a "bottom" electrode (BE) according to their arrangement in the figures, though no limitation is implied as to cell orientation in operation. The matrix 11 is shown in the figure containing a conductive path 14 which extends within the matrix 11 in a direction between the electrodes 12, 13. Cell 10 further includes an electrically-conductive component 15 which extends in a direction between the electrodes in contact with the matrix 11. For example, component 15 includes a layer of electrically-conductive material which extends from one electrode to the other and all around the matrix 11. The matrix 11 forms an elongated core of material within the electrically-conductive layer 15 which itself forms a sheath around the matrix core. In this example, the sheath and core have a generally circular cross-section giving a cylindrical shape. In general, however, these elements can be formed with any desired cross-sectional shape. Cell 10 can be surrounded by an insulating layer (not shown) for electric and thermal insulation of the cell.

The cell core 11, in this example, preferably has a thickness in the range of about 1 to 20 nm and a length in the range of about 5 to 100 nm. The electrically-conductive layer forming sheath 15 can be formed, for example, of TaN or TiN, and preferably has a thickness in the range of about 1 to 20 nm. The cell 10 can be fabricated using well-known material processing techniques for formation of the various elements of the cell. By way of example, the core and sheath structure can be produced by a keyhole-transfer process of the general type described in Raoux et al., IBM J. Res. & Dev. 52(4/5), 465 (2008). In some implementations of this cell design, the matrix core can include a nanowire (including a nanotube or nanoribbon) of the matrix material. Such nanowires can be fabricated by well-known techniques. In these implementations, the cell structure can be fabricated from the core out by first forming the nanowire core and then depositing the electrically-conductive layer forming component 15 on the outer surface of the nanowire. The electrodes can be formed at any convenient stage of the processing operation.

In general, the materials and dimensions of matrix 11 and component 15 are selected to satisfy particular resistance requirements. Specifically, the arrangement is such that the resistance presented by component 15 to a cell current produced by the read voltage for cells is greater than that of the conductive path 14 and less than that of the insulating matrix 11 in any of the s programmable cell states defined for multilevel operation.

Figure 1C:
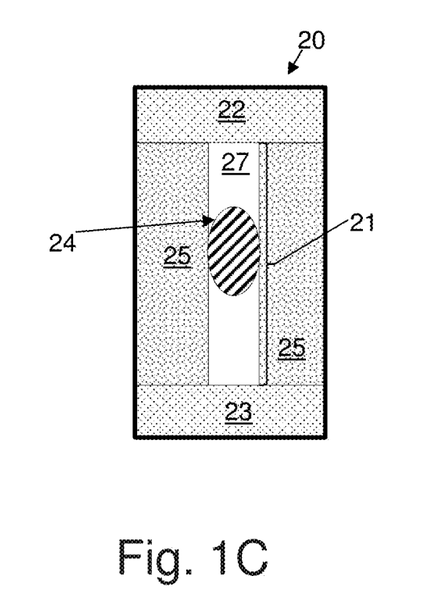
FIG. 1C shows a memory cell in one embodiment in accordance with an example the present disclosure.

FIG. 1C shows a memory cell in accordance with an example of the present disclosure. FIG. 1C is a schematic cross-sectional view of a memory cell according to an example of the present disclosure. The cell 10 has a phase-change material (PCM) 21 located between a first and second electrodes, 22 and 23, for connecting the cell to the word and bit lines, respectively, of the array e.g. 100. Such electrodes can be referred to herein as a TE and a BE according to their arrangement in the figures, though no limitation is implied as to cell orientation in operation. The PCM material 21 shown in the figure has an amorphous phase indicated by region 24 and a crystalline phase indicated by region 27. The relative proportions of these phases differ for the different programmable cell states. Cell 20 further includes an electrically-conductive component 25 which extends in a direction between the electrodes 22 and 23 in contact with the PCM material 21. For example, component 25 includes a layer of electrically-conductive material which extends from one electrode to the other and all around the PCM material 21 (e.g. on the outer surface of PCM material 21). The cell 20 may, for example, be surrounded by an insulating layer (not shown) for electrical and thermal insulation of the cell.

Figure 1D:
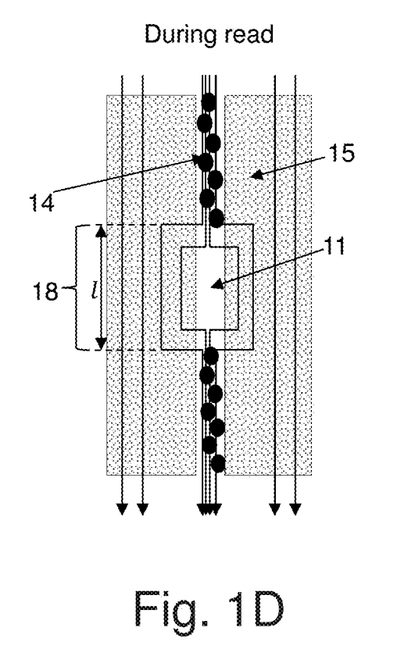
FIG. 1D indicates current flow in a cell during read operations for a particular cell state in one embodiment.

FIG. 1D indicates a current flow in cell 10 during read operations for a particular cell state. Current density is indicated schematically by spacing of the vertical arrows in the figure. Due to the resistance properties described above, in a read operation the cell current flows primarily through the conductive path 14 in preference to the sheath 15, and primarily through sheath 15 in preference to the insulating matrix 11 occupying the "gap" of length/in the conductive path. The resulting current path through the sheath 15 has a length which is dependent on length of the conductive path 14, decreasing as the path length increases within the matrix. In a write operation, however, where a significantly higher voltage is applied between the cell electrodes, the cell current flows primarily through the core 11.

Portion 18 of the cell 10 that has length/may be referred to as a projected memory. The projected memory 18 comprises the insulating matrix 11 and a segment of the component 15 that corresponds (e.g. in contact) with the insulating matrix 11.

The current flow as indicated in FIG. 1C may also be representative of the current flow in the cell 20 of FIG. 1C. In this case, the projected memory 18 may comprise the amorphous phase volume 24 and a segment of the component 25 that corresponds (e.g. in contact) with the amorphous phase volume 24.

Figure 2:
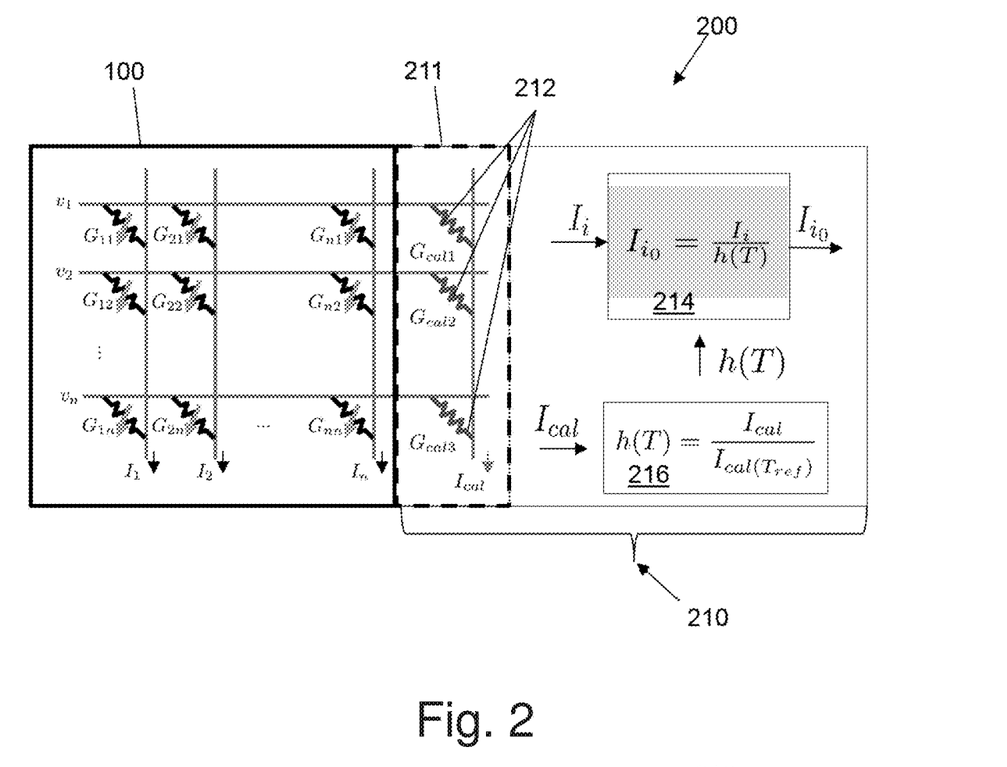
FIG. 2 depicts a memory circuit in one embodiment in accordance with an example of the present disclosure.

FIG. 2 depicts a memory circuit 200 in accordance with an example of the present disclosure. The memory circuit 200 comprises an apparatus 210 and a crossbar array e.g. 100.

The crossbar array 100 may be extended by a predefined set of memristors 212 of the apparatus 210. For example, the set of memristors 212 may form an additional column line 211 to the crossbar area 100. The apparatus 210 further comprises an adjustment circuit 214 and a calibration circuit 216.

In one example, the conductance values $G_{cal1}^0$, $G_{cal2}^0$ . . . $G_{caln}^0$ of the set of memristors 212 are known and stored, e.g. in the calibration circuit 216, for a reference temperature $T_{ref}$ and may stay unaffected by programming/mapping processes. Each of the memristors 212 provided with known conductance values may be a PCM cell or RRAM cell as described with reference to FIGS. 1B and 1C.

At any given vector of read voltages, the output current of the set of memristors 212 may be formulated as a function of the temperature as follows: $I_{cal}(T) = G_{cal1}v_1 + G_{cal2}v_2 + \ldots + G_{caln}v_n$, where $G_{cal_i} = h(T)G_{cal_i}^0$, for $i=1, \ldots n$, indicating that the conductance may change over time e.g. as the temperature changes $G_{cal1}$ may be different from $G_{cal1}^0$. The reference current for the same read voltages is known and may be determined by the calibration circuit 216 as follows: $I_{cal}(T_{ref}) = G_{cal1}^0 v_1 + G_{cal2}^0 v_2 + \ldots + G_{caln}^0 v_n$. And the ratio of $I_{cal}(T)$ and $I_{cal}(T_{ref})$ gives the compensation function $$h(T) = \frac{I_{cal}(T)}{I_{cal}(T_{ref})}.$$

The compensation function h(T) may be determined by the calibration circuit 216.

In another example, the adjustment circuit 214 may receive the two currents $I_{cal}(T_{ref})$ determined by the adjustment circuit 216 and $I_{cal}(T)$ output of the column line 211. The adjustment unit 214 may thus determine the compensation function h(T). The value of the compensation function h(T) is a measured variation of the measured current $I_{cal}(T)$ at the temperature T with respect to the reference current $I_{cal}(T_{ref})$. As indicated in FIG. 2, this measured variation h(T) may be used to compensate or correct or adjust the other currents $I_{1 \ldots n}$ of the columns lines of the array 100 that are output at temperature T to compensate at least for the variation due to the temperature.

In one example, the column line 211 may be part of the calibration circuit.

In case, each of the set of memristors 212 is a RRAM cell, the compensation function as used by the adjustment circuit 214 may be approximated or modeled as follows. This may enable a cross check of the measured results. The total conductance G of the projected memory 18 may be the sum of conductance $G_p$ of the segment of component 15 and the conductance $G_a$ of the insulating matrix in the projected memory 18. However, in this case $G_p \gg G_a$ i.e. the total conductance is dominated by the segment component which leads to $G(T) = G_{p0}f(T) + G_{a0}g(T) \cong G_{p0}f(T) = G_p(T)$.

Thus the current I and the compensated $I_0$ one through each device are:

$$I(T) = G(T)v \text{ and } I_0 = \frac{G_{p0}f(T)}{f(T)}v = \frac{I(T)}{f(T)} \cdot I_{cal_m}^0$$

are values which are known and stored for $T_{ref}$ & $v_{cal_m}$, where m is an index referring to the device 212.

$\Delta I_{ref}$ is the average of the ratios $$\frac{I_{cal_m}(T)}{I_{cal_m}^0}$$

as measured for each of the m reference devices 212, which is f(T). In this case, the number of devices 212 can be limited to one, or can be extended to m devices with the same or different conductance values.

Figure 3:
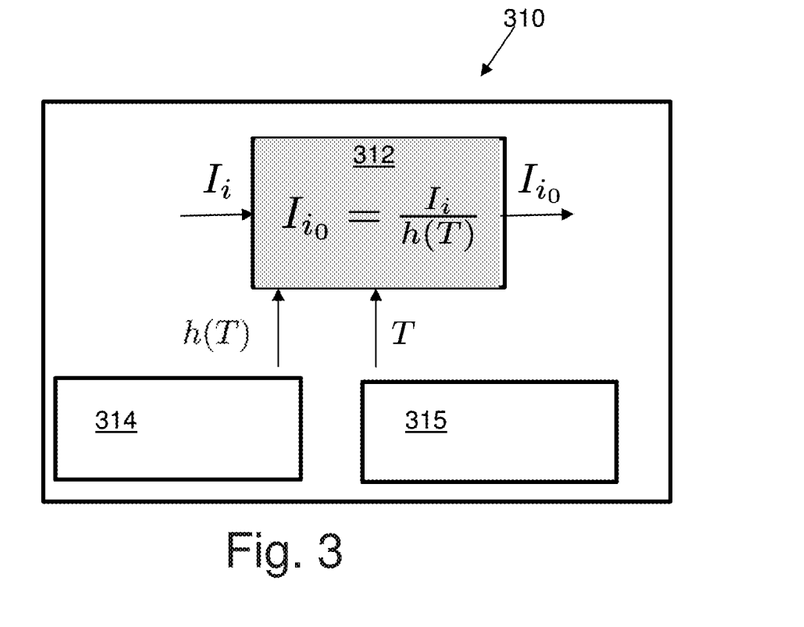
FIG. 3 depicts an apparatus in one embodiment in accordance with an example of the present disclosure.

FIG. 3 depicts an apparatus 310 in accordance with an example of the present disclosure. The apparatus 310 comprises an adjustment circuit 312, calibration circuit 314 and temperature sensor 315.

Figure 4:
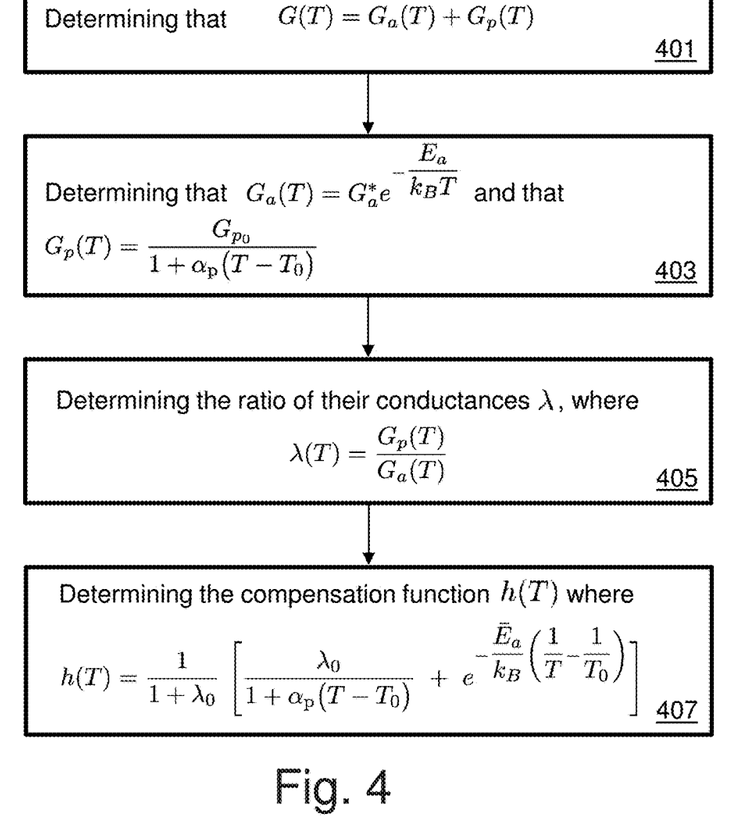
FIG. 4 is a flowchart of a method for modeling the variation of measured currents or conductances as function of the temperature in one embodiment.

The apparatus 310 may be configured to use a compensation function h(T) that can be used to correct the measured conductance G or current I, using the temperature as input variable. FIG. 4 describes a method for deriving or modeling the compensation function h(T) as used in FIG. 3. The calibration circuit 314 may for example be a look-up table that stores the values of the compensation function h(T) for different temperatures of the crossbar array 100, wherein the temperature defines the operating condition of the crossbar array 100.

The temperature sensor 315 may sense or measure a temperature of the crossbar array 100 and may provide temperature values that may be processed by the adjustment circuit 312.

The adjustment circuit 312 may be configured to receive a currently measured current of the crossbar array 100 and a temperature measured by the sensor 315. The adjustment circuit 312 may be configured to determine a variation of the received current with regard to a reference operating condition e.g. a reference temperature. The variation may be determined as a value of the compensation function h(T) at the received temperature. The variation may, for example, be determined by reading the look-up table for identifying the value of h(T) that corresponds to the measured temperature.

As indicated in FIG. 3, the adjustment circuit 312 may be configured to adjust the received current $I_{1 \ldots n}$ using the variation and provide as output the adjusted current. This may enable to compensate for the temperature effects on the measured currents.

FIG. 4 is a flowchart of a method for modeling the variation of measured currents or conductances as function of the temperature.

The correction or adjustment can be implemented using the compensation equation, $$G_{compensated} = \frac{G_{measured}}{h(T_{measured})},$$

where h(T) is the compensation function. The compensation function h(T) may be modeled as function of the temperature as follows.

The measured conductance G(T) of a cell such as cell 10 may be modeled as follows: $(T)=G_a(T)+G_p(T)$ in step 401, where the measured conductance is the addition of the phase-change and the projection segment's conductance values which are in parallel. The projection segment refers to the portion of the electrically-conductive component 15 having length l and that corresponds to the gap 18 as indicated in FIG. 1D or that corresponds to the amorphous phase volume 24 of FIG. 1C.

The phase-change conductance which may, for example, be the conductance of the amorphous phase volume 24 may be modeled in step 403 as function of the temperature as follows:

$$G_a(T) = G_a^* e^{-\frac{E_a}{k_B T}},$$

where $E_a$ is the activation energy of the material in the electrically-insulating matrix.

The projection segment's conductance may be modeled as function of the temperature as follows:

$$G_p(T) = \frac{G_{p_0}}{1+\alpha_p(T-T_0)}.$$

The compensation function h(T) may be used to translate G(T) to $G_0$, at any given temperature as follows $$G_0 = \frac{G(T)}{h(T)} = \frac{G_{a_0} g(T) + G_{p_0} f(T)}{h(T)}.$$

The projected memory 18 consists of two resistors in parallel that have the same volume ratio for any conductance state. The ratio of their sheet-resistances is defined by design and it is a known number: $\lambda$. Therefore the ratio of their conductances is $\lambda$ as well $$\lambda = \frac{R_{s_a}}{R_{s_p}} \rightarrow G_p = \lambda G_a.$$

But due to the fact that $G_a$ and $G_p$ have different dependence on temperature, the ratio $\lambda$ is a function of temperature. Although the ratio $\lambda$ can be measured for different temperatures and a lookup table comprising the measured ratio may be provided in the apparatus 310. In another example, the ration may preferably be included in h(T) to avoid the use of a look-up table. For the derivation $\lambda_0$ may be used. $\lambda_0$ is the value of $\lambda$ at a reference temperature e.g. 300 K and may be defined as follows.

$$\lambda(T_0) \equiv \lambda_0 = \frac{G_{p_0}}{G_{a_0}} = \frac{G_{p_0}}{G_a^*} e^{\frac{E_a}{k_B T_0}}.$$

Activation energy is treated as a constant number in the compensation scheme. Typically it is distributed in a Gaussian manner around a mean value, therefore from now on $E_a \rightarrow \overline{E}_a$ to describe the complete array of devices.

The ratio-function $\lambda(T)$ may be extracted using A as follows:

$$\lambda(T) = \frac{G_p(T)}{G_a(T)} = \frac{G_{p_0}}{1+\alpha_p(T-T_0)} \frac{1}{G_a^*} e^{\frac{e_A}{k_B T}} =$$

$$\frac{G_{p_0} \lambda_0}{[1+\alpha_p(T-T_0)]G_{p_0}} e^{-\frac{E_a}{k_B T_0}} e^{\frac{E_a}{k_B T}} = \frac{\lambda_0}{1+\alpha_p(T-T_0)} e^{\frac{E_a}{k_B}\left(\frac{1}{T}-\frac{1}{T_0}\right)}.$$

$G_a$ and $G_p$ are in parallel and they can be expressed in terms of the total conductance using $\lambda(T)$. This ends up to the following expression which is factored into a temperature independent component $G_0$ and a temperature equation.

$$G(T) = G_a(T) + G_p(T) = \frac{G_p(T)}{\lambda(T)} + G_p(T) = \frac{1+\lambda(T)}{\lambda(T)} \frac{G_{p_0}}{1+\alpha_p(T-T_0)} =$$

$$\frac{1+\lambda(T)}{\lambda(T)} \frac{1}{1+\alpha_p(T-T_0)} \frac{\lambda_0}{1+\lambda_0} G_0 = \frac{1+\lambda(T)}{1+\lambda_0} e^{\frac{E_a}{k_B}\left(\frac{1}{T}-\frac{1}{T_0}\right)} G_0 =$$

$$\frac{1}{1+\lambda_0}\left[\frac{\lambda_0}{1+\alpha_p(T-T_0)} + e^{-\frac{E_a}{k_B}\left(\frac{1}{T}-\frac{1}{T_0}\right)}\right] G_0.$$

The compensation function h(T) which is the one that compensates the measured conductance, having T as the only input variable is as follows:

$$h(T) = \frac{1}{1+\lambda_0}\left[\frac{\lambda_0}{1+\alpha_p(T-T_0)} + e^{-\frac{E_a}{k_B}\left(\frac{1}{T}-\frac{1}{T_0}\right)}\right].$$

In the case of a projected memory which has very large $\lambda_0$, h(T) reduces to f(T), which is the one that describes the temperature dependence of the projection segment. A simplified case for $$\lambda_0 \gg 1 \text{ implies } \frac{1}{1+\lambda_0} \cong 0 \text{ and } \frac{\lambda_0}{1+\lambda_0} \cong 1 \text{ and thus,}$$

$$h(T) = \frac{1}{1+\alpha_p(T-T_0)} = f(T).$$

The scheme that uses h(T) may be referred to as $2^{nd}$ order compensation scheme and the scheme that uses f(T) may be referred as $1^{st}$ order compensation scheme.

Figure 5:
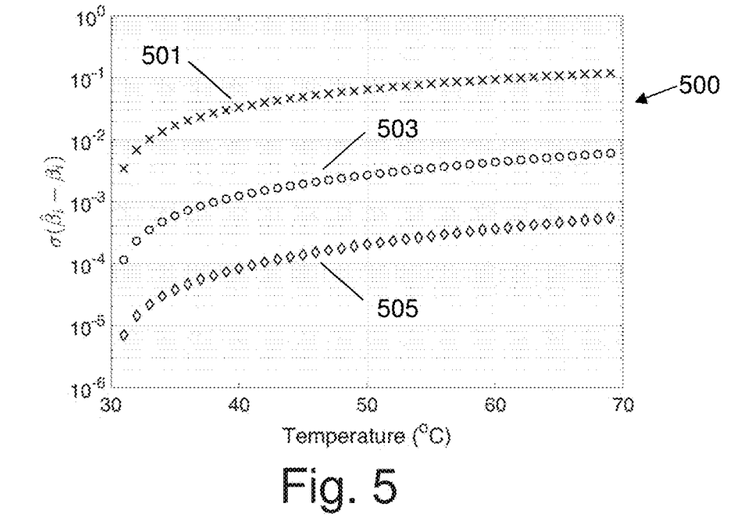
FIG. 5 shows the standard deviation of the error between reference and compensated results of a numerically simulated matrix-vector multiplication by a crossbar array as a function of temperature in one embodiment.

Plot 500 of FIG. 5 shows the standard deviation of the error between reference and compensated results of a numerically simulated matrix-vector multiplication by the crossbar array (e.g. 100) as a function of temperature. The plot 500 indicates this error's standard deviation as function of temperature for two types of cells. The first type of cells is the one described, for example, with reference to FIGS. 1B and 1C and the second type of cells is a cell (e.g. a PCM cell) that does not comprise the electrically conductive component 15. Curve 501 corresponds to the second type of cells whose outputs are corrected with at least part of the present method e.g. Curves 503-505 correspond to the first type of cells, wherein curve 503 is the first type of cells whose outputs are corrected or compensated using the $1^{st}$ order compensation scheme and curve 505 is the first type of cells whose outputs are corrected or compensated using the $2^{nd}$ order compensation scheme. The horizontal axis of the plot 500 indicates the temperature values and the vertical axis indicates the standard deviation $\sigma(\hat{\beta}_i-\beta_i)$ of the error of $\hat{\beta}_i$ with respect to $\beta_i$ (e.g. the error may be defined by the difference where $\hat{\beta}_i-\beta_i$) and refer to compensated and reference output or measurement (e.g. proportional to a measured current) respectively. This indicates performances are increased with the present method.

Various embodiments are specified in the following numbered clauses.

1. An apparatus for a memristor crossbar array, the apparatus comprising:
an adjustment circuit configured for receiving a current that is output by the array at an actual operating condition of the array;
a calibration circuit configured for determining a measured or modeled variation of output currents of the array at the actual operating condition with respect to a reference operating condition, wherein the adjustment circuit is configured to adjust the output current by the variation.

2. The apparatus of clause 1, wherein the calibration circuit comprises a set of memristors having a predefined and stable resistance at the reference operating condition, the set of memristors being configured to be inserted as a column line in the array, wherein the measured variation is the difference between the output current of the set of memristors at the actual operating condition and the output current of the set of memristors at the reference operating condition.

3. The apparatus of clause 1 or 2, wherein the calibration circuit is configured to provide the determined variation as input to the adjustment circuit.

4. The apparatus of clause 2 or 3, wherein each memristor of the set of memristors is a memristor of the array.

5. The apparatus of clause 2 or 3, wherein each memristor of the set of memristors is a cell for storing information in a plurality of programmable cell states, the cell comprising:
a first electrode and a second electrode such that an electrically-conductive path, extending in a direction between said electrodes, is formed on application of a write or read voltage to said electrodes; and
an electrically-insulating matrix located between a first electrode and a second electrode such that an electrically-conductive path, extending in a direction between said electrodes, is formed within said matrix on application of a write voltage to said electrodes;
an electrically-conductive component in contact and extending between the first electrode and the second electrode;
wherein a resistance is presented by said electrically-conductive component; and
wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in said matrix.

6. The apparatus of clause 1, wherein the calibration circuit comprises a memory storing the modeled variation that is determined based on a model of the conductance of the array as function of the operating condition.

7. The apparatus of clause 1 or 6, further comprising a temperature sensitive element for measuring the temperature of the array, wherein the adjustment circuit is configured to receive the measured temperature and to determine the modeled variation using the measured temperature and a model of variation.

8. The apparatus of clause 6 or 7, wherein each memristor of the set of memristors is a cell for storing information in a plurality of programmable cell states, the cell comprising:
an electrically-insulating matrix located between a first electrode and a second electrode such that an electrically-conductive path, extending in a direction between said electrodes, is formed within said matrix on application of a write voltage to said electrodes;
an electrically-conductive component in contact and extending between the first electrode and the second electrode;
wherein a resistance is presented by said electrically-conductive component; and
wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in said matrix.

9. The apparatus of any of the clauses 6 to 8, wherein the modeled variation is a value of the following model of the variation $$h(T) = \frac{1}{1+\lambda_0}\left[\frac{\lambda_0}{1+\alpha_p(T-T_0)} + e^{-\frac{E_a}{k_B}\left(\frac{1}{T}-\frac{1}{T_0}\right)}\right],$$

where T and $T_0$ are the temperatures defining the actual and reference operating conditions respectively, $\overline{E}_a$ is the average activation energy of the electrically-insulating matrix, $\lambda_0$ is the ratio of the conductance of the electrically-conductive component and the conductance of the electrically-insulating matrix at the reference operating condition, $k_B$ is the Boltzmann constant, $\alpha_p$ is the temperature coefficient of resistance.

10. The apparatus of any of the clauses 1-9, wherein the operating condition is given or defined by a temperature of the array.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus for a memristor crossbar array, the apparatus comprising:
    a first circuit configured for receiving a current that is output by an array at an actual operating condition of the array; and
    a second circuit configured for determining a measured or modeled variation of output currents of the array at the actual operating condition with respect to a reference operating condition, wherein the first circuit is configured to adjust the output current by the variation,
    the variation determined as a value of a compensation function corresponding to a measured temperature associated with the actual operating condition.

2. The apparatus of claim 1, wherein the second circuit comprises a set of memristors having a predefined and stable resistance at the reference operating condition, the set of memristors being configured to be inserted as a column line in the array, wherein the measured variation is the difference between the output current of the set of memristors at the actual operating condition and the output current of the set of memristors at the reference operating condition.

3. The apparatus of claim 1, wherein the second circuit is configured to provide the determined variation as input to the first circuit.

4. The apparatus of claim 2, wherein each memristor of the set of memristors is a memristor of the array.

5. The apparatus of claim 2, wherein each memristor of the set of memristors is a cell for storing information in a plurality of programmable cell states, the cell comprising:
 a first electrode and a second electrode such that an electrically-conductive path, extending in a direction between said electrodes, is formed on application of a write or read voltage to said electrodes; and
 an electrically-insulating matrix located between a first electrode and a second electrode such that an electrically-conductive path, extending in a direction between said electrodes, is formed within said matrix on application of a write voltage to said electrodes;
 an electrically-conductive component in contact and extending between the first electrode and the second electrode;
 wherein a resistance is presented by said electrically-conductive component; and
 wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in said matrix.

6. The apparatus of claim 1, wherein the second circuit comprises a memory storing the modeled variation that is determined based on a model of the conductance of the array as function of the operating condition.

7. The apparatus of claim 1, further comprising a temperature sensitive element for measuring the temperature of the array, wherein the first circuit is configured to receive the measured temperature and to determine the modeled variation using the measured temperature and a model of variation.

8. The apparatus of claim 6, wherein each memristor of the set of memristors is a cell for storing information in a plurality of programmable cell states, the cell comprising:
 an electrically-insulating matrix located between a first electrode and a second electrode such that an electrically-conductive path, extending in a direction between said electrodes, is formed within said matrix on application of a write voltage to said electrodes;
 an electrically-conductive component in contact and extending between the first electrode and the second electrode;
 wherein a resistance is presented by said electrically-conductive component; and
 wherein said cell is arranged such that said resistance is at least about that of said electrically-conductive path and at most about that of said electrically-insulating matrix in any of said plurality of programmable cell states, wherein said plurality of programmable cell states corresponds to a respective configuration of said electrically conductive path in said matrix.

9. The apparatus of claim 8, wherein the modeled variation is a value of the following model of the variation $$h(T) = \frac{1}{1+\lambda_0}\left[\frac{\lambda_0}{1+\alpha_p(T-T_0)} + e^{-\frac{E_a}{k_B}\left(\frac{1}{T}-\frac{1}{T_0}\right)}\right],$$

where $T$ and $T_0$ are the temperatures defining the actual and reference operating conditions respectively, $\overline{E}_a$ is the average activation energy of the electrically-insulating matrix, $\lambda_0$ is the ratio of the conductance of the electrically-conductive component and the conductance of the electrically-insulating matrix at the reference operating condition, $k_B$ is the Boltzmann constant, $\alpha_p$ is the temperature coefficient of resistance.

10. The apparatus of claim 1, wherein the operating condition is given by a temperature of the array.

11. A memory circuit comprising an apparatus and a memristor crossbar array, wherein the apparatus comprises:
 a first circuit configured for receiving a current that is output by an array at a current operating condition of the array; and
 a second circuit configured for providing a reference current at a reference operating condition of the array, and for determining a variation to the reference current at the current operating condition, wherein the first circuit is configured to adjust the output current by the variation,
 the variation determined as a value of a compensation function corresponding to a measured temperature associated with the actual operating condition.

12. The circuit of claim 11, wherein the second circuit comprises a set of memristors having a known resistance at the reference operating condition, the set of memristors being configured to be inserted as a column line in the array, wherein the measured variation is the difference between the output current of the set of memristors at the actual operating condition and the output current of the set of memristors at the reference operating condition.

13. The circuit of claim 11, wherein the second circuit is configured to provide the determined variation as input to the first circuit.

14. The circuit of claim 12, wherein each memristor of the set of memristors is a memristor of the array.

15. The circuit of claim 12, wherein each memristor of the set of memristors is a cell for storing information in a plurality of programmable cell states, the cell comprising:
 an electrically-insulating matrix located between a first electrode and a second electrode such that an electrically-conductive path, extending in a direction between said electrodes, is formed on application of a write voltage to said electrodes; and
 an electrically-conductive component in contact and extending between the first electrode and the second electrode;
 wherein a resistance is presented by said electrically-conductive component; and
 wherein said cell is arranged such that said resistance is at least about that of said electrically-conductive path and at most about that of said electrically-insulating matrix in any of the plurality of programmable cell states, wherein said plurality of programmable cell states corresponds to a respective configuration of said electrically conductive path in said matrix.

16. The circuit of claim 11, wherein the second circuit comprises a memory storing the modeled variation that is determined based on a model of the conductance of the array as function of the operating condition.

17. The circuit of claim 11, further comprising a temperature sensor for measuring the temperature of the array, wherein the first circuit is configured to receive the measured temperature and to determine the modeled variation using the measured temperature and a model of variation.

18. A method for a memristor crossbar array comprising:
receiving a current that is output by the array at an actual operating condition of the array;
measuring or modeling a variation of output currents of the array at the actual operating condition with respect to a reference operating condition; and
adjusting the output current by the variation,
the variation determined as a value of a compensation function corresponding to a measured temperature associated with the actual operating condition.

19. The method of claim 18, wherein each memristor of the set of memristors is a RRAM cell for storing information in a plurality of programmable cell states, the RRAM cell comprising: an electrically-insulating matrix located between a first electrode and a second electrode such that an electrically-conductive path, extending in a direction between said electrodes, is formed within said matrix on application of a write voltage to said electrodes; and an electrically-conductive component in contact and extending between the first electrode and the second electrode; wherein a resistance is presented by said electrically-conductive component; and wherein said RRAM is arranged such that said resistance is at least about that of said electrically-conductive path and at most about that of said electrically-insulating matrix in any of said plurality of programmable cell states, wherein modeling the variation comprises:
splitting the conductance of each cell into two temperature dependent conductance $G\dagger(T)$ and $G\ddagger(T)$ corresponding to the electrically-insulating matrix and to a segment of the electrically-conductive component that is parallel to the matrix;
modeling each of $G\dagger(T)$ and $G\ddagger(T)$ as function of the temperature based on the structure of the cell as follows:

$$G_a(T) = G_a^* e^{-\frac{E_a}{k_B T}} \text{ and } G_p(T) = \frac{G_{p_0}}{1 + \alpha_p(T - T_0)},$$

where $\widehat{G\dagger} \equiv G_p$ and $\widehat{G\ddagger} \equiv G_a$;

generating a compensating function h(T) using the modeled conductances, wherein the compensating function is the ration of the conductance of each cell at a temperature T and the conductance of the cell at a reference temperature; and
determining the variation using h(T).

* * * * *